(12) United States Patent
Murakoshi

(10) Patent No.: US 9,136,125 B2
(45) Date of Patent: Sep. 15, 2015

(54) SUBSTRATE OF SEMICONDUCTOR DEVICE, FOR GETTERING METALLIC IMPURITY

(75) Inventor: Atsushi Murakoshi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,683

(22) Filed: Aug. 31, 2012

(65) Prior Publication Data

US 2013/0249061 A1    Sep. 26, 2013

(30) Foreign Application Priority Data

Mar. 23, 2012 (JP) .................................. 2012-068471

(51) Int. Cl.
| | | |
|---|---|---|
| *H01L 23/544* | (2006.01) | |
| *H01L 21/265* | (2006.01) | |
| *H01L 21/322* | (2006.01) | |
| *H01L 27/146* | (2006.01) | |

(52) U.S. Cl.
CPC ...... *H01L 21/26513* (2013.01); *H01L 21/3221* (2013.01); *H01L 27/14603* (2013.01)

(58) Field of Classification Search
CPC ..................... H01L 21/26513; H01L 21/3221; H01L 27/14603
USPC .......................................... 257/620, E29.109
IPC ....... H01L 21/046, 21/041, 21/02579, 21/0455, H01L 21/0415
See application file for complete search history.

(56) References Cited

U.S. PATENT DOCUMENTS

| | | | |
|---|---|---|---|
| 5,413,943 A | 5/1995 | Murakoshi et al. | |
| 5,698,891 A | 12/1997 | Tomita et al. | |
| 5,757,063 A | 5/1998 | Tomita et al. | |
| 6,090,645 A | 7/2000 | Hamada | |
| 6,610,262 B1 * | 8/2003 | Peng et al. | 423/197 |
| 8,344,337 B2 * | 1/2013 | Lee | 250/492.3 |
| 2002/0037632 A1 | 3/2002 | Horikawa | |
| 2003/0057493 A1 | 3/2003 | Hirabayashi | |
| 2005/0233499 A1 * | 10/2005 | Okuda et al. | 438/118 |
| 2007/0089666 A1 | 4/2007 | Koike | |
| 2008/0105971 A1 * | 5/2008 | Okuda et al. | 257/737 |
| 2010/0090303 A1 | 4/2010 | Takizawa | |

(Continued)

FOREIGN PATENT DOCUMENTS

| | | |
|---|---|---|
| JP | 1-303727 | 12/1989 |
| JP | 5-243555 | 9/1993 |
| JP | 7-37893 | 2/1995 |

(Continued)

OTHER PUBLICATIONS

Werheit, "Optical Characterization of Icosahedral Boron Modifications and Compounds," Proc. 9$^{th}$ Int. Symp. Boron, Borides and Rel. Comp. (1987), pp. 142-153.

(Continued)

*Primary Examiner* — Thanh T Nguyen
(74) *Attorney, Agent, or Firm* — Finnegan, Henderson, Farabow, Garrett & Dunner, L.L.P.

(57) ABSTRACT

According to an embodiment, a semiconductor device includes a substrate provided with a first region including an active element, the substrate including a second region containing boron with a density of $2\times10^{20}$ cm$^{-3}$ or more on a surface excluding the first region.

11 Claims, 6 Drawing Sheets

(56) References Cited

U.S. PATENT DOCUMENTS

2011/0136300 A1* 6/2011 Vobecky et al. .............. 438/135
2011/0281406 A1 11/2011 Ogino et al.

FOREIGN PATENT DOCUMENTS

| JP | 9-148335 | 6/1997 |
| JP | 10-303207 | 11/1998 |
| JP | 2000-21887 | 1/2000 |
| JP | 2000-114514 | 4/2000 |
| JP | 2010-41000 | 2/2010 |
| JP | 2011-151318 | 8/2011 |
| JP | 2011-243670 | 12/2011 |
| WO | WO 03-060982 A2 | 7/2003 |

OTHER PUBLICATIONS

Notification of Reason(s) for Refusal issued by the Japanese Patent Office on Jul. 14, 2014, for Japanese Patent Application No. 2012-068471, and English-language translation thereof.

Notification of Reason(s) for Refusal issued by the Japanese Patent Office on Mar. 17, 2015, for Japanese Patent Application No. 2012-068471, and English-language translation thereof.

* cited by examiner

SUBSTRATE OF SEMICONDUCTOR DEVICE, FOR GETTERING METALLIC IMPURITY

CROSS-REFERENCE TO RELATED APPLICATIONS

This application is based upon and claims the benefit of priority from Japanese Patent Application No. 2012-068471, filed on Mar. 23, 2012; the entire contents of which are incorporated herein by reference.

FIELD

Embodiments are generally related to a semiconductor device, a method for manufacturing the same, and a substrate.

BACKGROUND

A semiconductor device preferably uses a substrate that getters metallic impurities in a manufacturing process thereof. For example, a silicon substrate with precipitation nuclei may getter metallic impurities, incorporating a metal element into the precipitation nucleus that contains oxygen, nitrogen, and boron that serves as a p-type impurity. There is also a method for gettering metallic impurities, using dislocations formed in a polysilicon layer provided on the backside of a silicon substrate. Further, a method is developed for forming a precipitation nucleus having a larger size and a higher density than the precipitation nucleus containing oxygen, nitrogen, and boron, using the carbon doping into a silicon crystal. Hence, it becomes possible, for example, to reduce white defects in an image sensor and to improve reliability of a gate dielectric film by increasing the gettering amount of metallic impurities.

According to the method using the carbon doping, no precipitation nucleus is formed while performing a crystal growth of silicon, and an initial nucleus is formed by a heat treatment at approximately 800° C. and enlarged by a heat treatment at 1000° C. or higher in wafer processing. That is, such heat treatments with high temperature are needed in the manufacturing process to form a precipitation nucleus containing carbon.

In recent years, the manufacturing process of a semiconductor device with an increasingly finer structure tends to limit a thermal budget in the wafer processing. For example, short-time heat treatment using RTA (Rapid Thermal Annealing) is preferably used, causing a precipitation nucleus to disappear and significant degradation in size and density of a precipitation nucleus. In addition, the application of transition metals such as titanium Ti, nickel Ni, and cobalt Co with a large diffusion coefficient at low temperature is broadening and raising the importance of gettering. Thus, a semiconductor device that improves the gettering of metallic impurities and a method of manufacturing such a semiconductor device are needed in a manufacturing process with the thermal budget limit.

DETAILED DESCRIPTION

Figure 1:
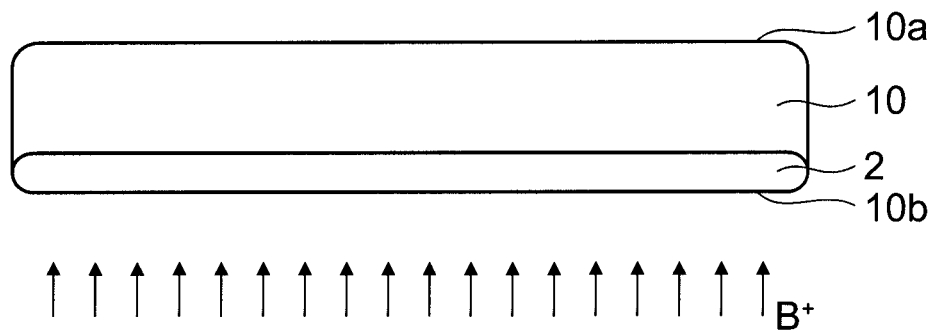
FIG. 1 is a schematic sectional view illustrating a substrate according to a first embodiment.

According to an embodiment, a semiconductor device includes a substrate provided with a first region including an active element, the substrate including a second region containing boron with a density of $2 \times 10^{20}$ cm$^{-3}$ or more on a surface excluding the first region.

The embodiments of the invention will be described below with reference to the drawings. The same reference numerals are attached to the same portions in the drawings and a detailed description of the same portions is appropriately omitted to focus on different portions.

First Embodiment

FIG. 1 is a schematic sectional view illustrating a is substrate 10 according to a first embodiment. The substrate 10 is, for example, a phosphorus (P) doped silicon substrate and includes a first major surface 10a and a second major surface 10b.

The first major surface 10a is provided with, for example, a first region containing an active element such as a transistor. The substrate 10 includes a second region containing boron (B) in the density of $2 \times 10^{20}$ cm$^{-3}$ or more in the surface of the substrate 10 excluding the first region.

As illustrated in FIG. 1, the second region according to the embodiment is the second major surface 10b opposite to the first major surface 10a and is formed by ion implantation of boron. For example, the ion implantation of boron is performed under conditions of implantation energy 35 keV and the dose amount $1 \times 10^{17}$ cm$^{-2}$ to form a supersaturated impurity layer 2 on the side of the second major surface 10b. Boron may be implanted on the entire surface of the second major surface 10b or selectively. As will be described later, the first region containing CMOSFET is provided on the first major surface 10a.

Boron implanted under the above conditions is distributed in the depth direction and has a peak in the depth position of about 0.13 μm from the second major surface 10b. The peak concentration of boron is about $7.5 \times 10^{21}$ cm$^{-3}$. For example, the solubility limit of boron with respect to silicon is about $2 \times 10^{20}$ cm$^{-3}$ in concentration and the peak concentration is about 30 times the solubility limit. Thus, boron is contained in a super saturation state near the implantation peak and a $B_{12}$ cluster is formed with an icosahedral structure including 12 boron atoms.

Figure 2A:
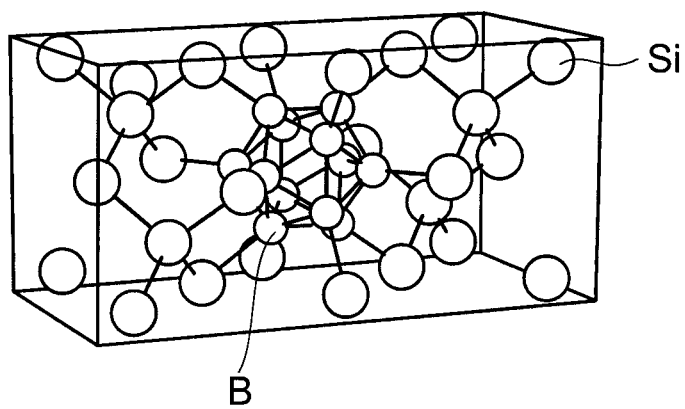
FIGS. 2A to 2C are schematic diagrams illustrating a crystal structure of the substrate according to the first embodiment.
Figures 2B, 2C:
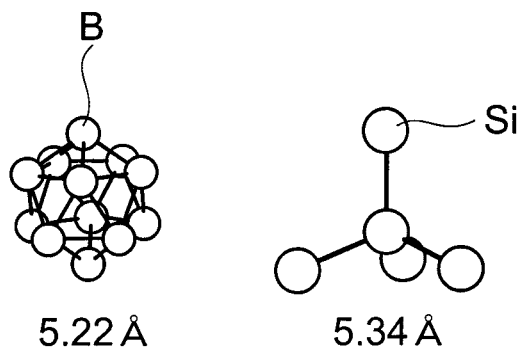

FIGS. 2A to 2C are schematic diagrams illustrating a crystal structure of the substrate 10. FIG. 2A is a perspective view illustrating the crystal structure of the supersaturated impurity layer 2. FIGS. 2B and 2C are perspective views of a $B_{12}$ cluster and a minimum cluster of silicon (Si) respectively.

The supersaturated impurity layer 2 illustrated in FIG. 2A contains the $B_{12}$ cluster including 12 boron atoms immediately after ion implantation. As illustrated in FIG. 2B, the $B_{12}$ cluster has an icosahedral structure and is dissolved in a silicon crystal. For example, the minimum cluster of silicon illustrated in FIG. 2C has a tetrahedral structure including five silicon atoms and the size of the cluster is 5.34 Å. By contrast, the size of the $B_{12}$ cluster is 5.22 Å; thereby a silicon cluster can easily be substituted for the $B_{12}$ cluster. Thus, the $B_{12}$ cluster can be stably dissolved in silicon.

The $B_{12}$ cluster dissolved in silicon creates a bivalent electron deficiency state. For example, boron implanted in the concentration of $1.2 \times 10^{21}$ cm$^{-3}$ forms a $B_{12}$ cluster in the density of $1 \times 10^{20}$ cm$^{-3}$ and generates a hole concentration of $2 \times 10^{20}$ cm$^{-3}$. That is, the hole concentration of the solubility limit or more is obtained by implanting boron to achieve the concentration of $1.2 \times 10^{21}$ cm$^{-3}$. Since the bivalent electron deficiency state created by the $B_{12}$ cluster is stabilized by incorporating metallic elements, the supersaturated impurity layer 2 including the $B_{12}$ cluster serves as a gettering layer of metallic impurities.

Next, some properties of the supersaturated impurity layer 2 will be described with reference to FIGS. 3 to 7. No method to increase the gettering amount of metallic impurities such as nitrogen doping and carbon doping is taken for the substrate from which data shown here is taken. The amounts of oxygen and carbon incorporated during the crystal growth are $9 \times 10^{17}$ to $1.2 \times 10^{18}$ cm$^{-3}$ and $2 \times 10^{16}$ cm$^{-3}$ respectively and a precipitation nucleus having a large size and a high density cannot be formed.

Figure 3:
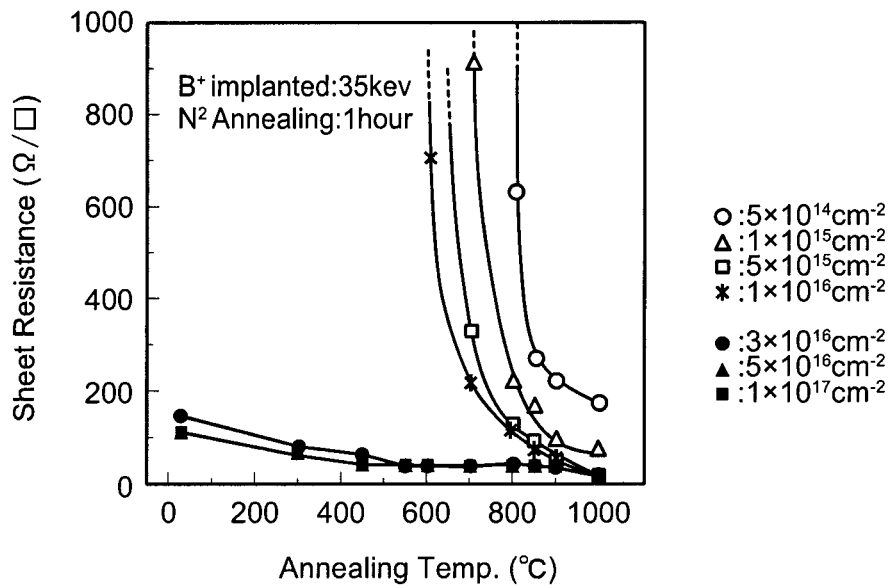
FIGS. 3 to 7 are graphs showing the substrate properties according to the first embodiment.

FIG. 3 is a graph illustrating a relationship between sheet resistance of the supersaturated impurity layer 2 and an annealing temperature. The vertical axis represents the sheet resistance ($\Omega$/□) and the horizontal axis represents the annealing temperature (° C.). FIG. 3 illustrates changes of sheet resistance from the state immediately after ion implantation (25° C.) up to the annealing temperature 1000° C. by using the dose amount of boron as a parameter.

In the ion implantation to form the supersaturated impurity layer 2, the implantation energy is set to 35 keV and the dose amount of implanted boron is changed in the range of $5 \times 10^{14}$ cm$^{-2}$ to $1 \times 10^{17}$ cm$^{-2}$. Heat treatment for one hour is performed at each annealing temperature and then the sheet resistance of the supersaturated impurity layer 2 is measured.

As illustrated in FIG. 3, changes of sheet resistance are vastly different between a case when the dose amount of boron is $1 \times 10^{16}$ cm$^{-2}$ or less and a case when the dose amount of boron is $3 \times 10^{16}$ cm$^{-2}$ or more. When the dose amount of boron is $1 \times 10^{16}$ cm$^{-2}$ or less, the sheet resistance becomes measurable after heat treatment at about 600° C. or more and the sheet resistance decreases with a rising heat treatment temperature. This shows general behavior of activation of ion-implanted impurities. When the dose amount of boron exceeds $3 \times 10^{16}$ cm$^{-2}$, by contrast, the sheet resistance becomes measurable immediately after ion implantation (25° C.) without heat treatment and the sheet resistance changes gradually as raising the heat treatment temperature. This indicates that when the dose amount of boron exceeds $3 \times 10^{16}$ cm$^{-2}$, a phenomenon occurs in a different way from the normal one.

Figure 4:
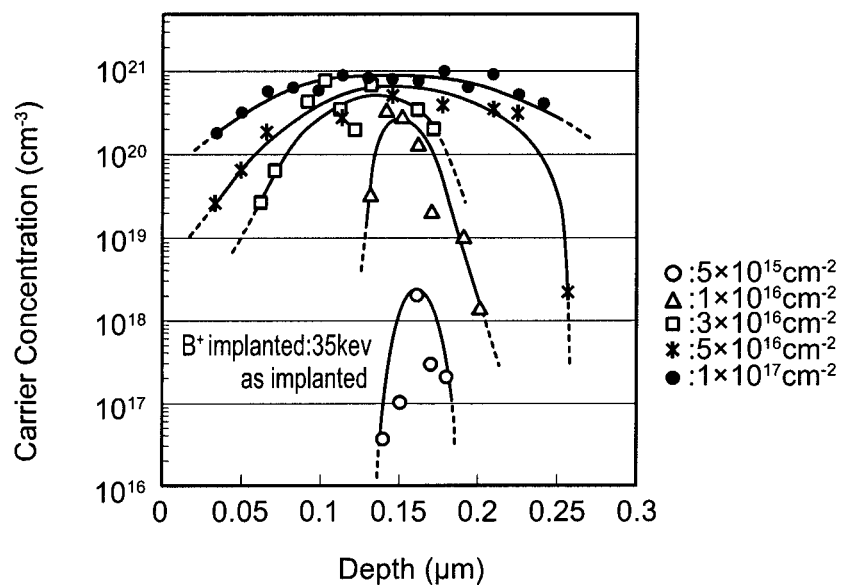

FIG. 4 is a graph illustrating the carrier concentration distribution of the supersaturated impurity layer 2 immediately after ion implantation. The vertical axis represents the carrier concentration and the horizontal axis represents the depth from the second major surface 10b. The carrier concentration is measured by using the Hall measurement.

When the dose amount of boron is $5 \times 10^{15}$ cm$^{-2}$ or less, carriers of about $3 \times 10^{17}$ cm$^{-3}$ are generated in the peak position of implantation, but the implanted boron is not activated for the most part. If the dose amount exceeds $1 \times 10^{16}$ cm$^{-2}$, on the other hand, carriers of $1 \times 10^{20}$ cm$^{-3}$ are generated. Further, it is evident that the width of the carrier concentration distribution broadens with an increasing dose amount.

When the dose amount of boron exceeds $1 \times 10^{16}$ cm$^{-2}$, the carrier concentration exceeds $2 \times 10^{20}$ cm$^{-3}$, which is the solubility limit concentration of boron in silicon. When the dose amount of boron is set to $1 \times 10^{17}$ cm$^{-2}$, the peak concentration reaches $1 \times 10^{21}$ cm$^{-3}$, and the supersaturated region is formed from the surface up to the depth of 0.25 µm, where the carrier concentration exceeds the solubility limit.

Figure 5:
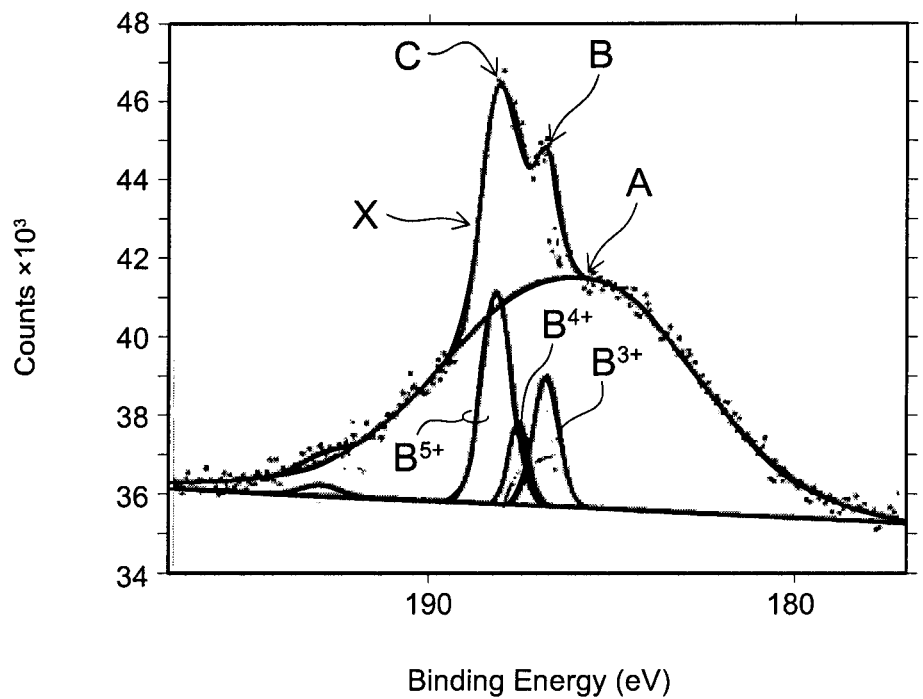

FIG. 5 is a graph illustrating results of measuring binding energy near the 1s orbit of boron atom contained in the supersaturated impurity layer 2 by using X-ray photoelectron spectroscopy (XPS). The horizontal axis represents the binding energy and the vertical axis represents spectral intensity.

As the atomic bindings of boron in silicon, binding of the coordination number 3 corresponding to peak $B^{3+}$ at 186.8 eV and binding of the coordination number 4 corresponding to peak $B^{4+}$ at 187.5 eV are known as illustrated in FIG. 5.

The graph X illustrated in FIG. 5 is an XPS spectrum of the supersaturated impurity layer 2 when the dose amount of boron is set to $1 \times 10^{17}$ cm$^{-2}$ and in addition to a peak A corresponding to the coordination number 3 and a peak B corresponding to the coordination number 4, a peak C with still higher intensity is observed. Binding energy of the peak C is 188.1 eV and corresponds to binding $B^{5+}$ of the coordination number 5. That is, binding of the coordination number 5 is dominant in boron contained in the supersaturated impurity layer 2. Then, binding of the coordination number 5 is binding of metal boron and corresponds to binding of a $B_{12}$ cluster including 12 boron atoms.

Figure 6:
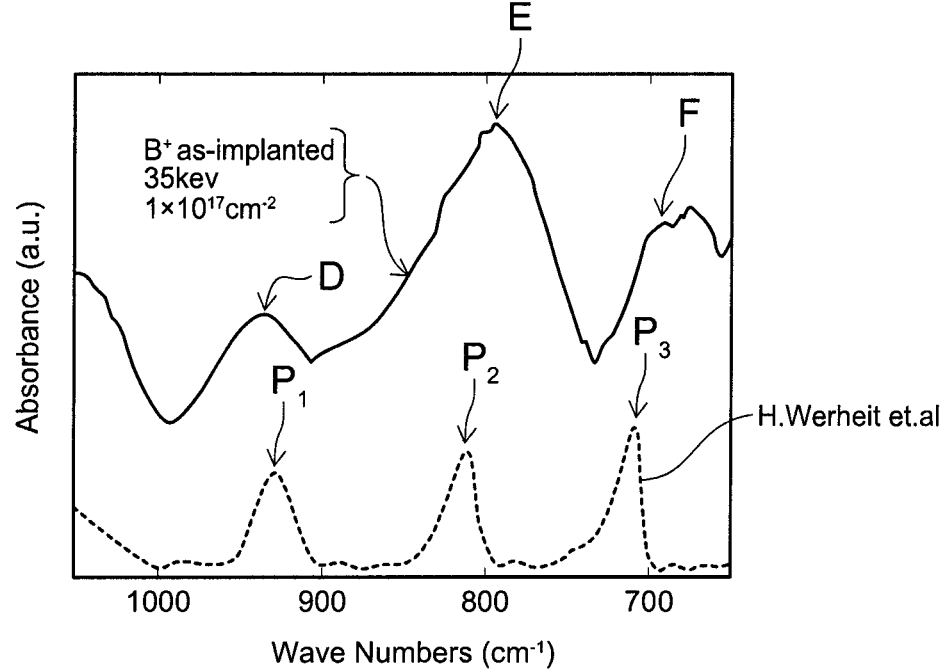

FIG. 6 illustrates an infrared absorption spectrum of the supersaturated impurity layer 2, which contains boron with the dose amount of $1 \times 10^{17}$ cm$^{-2}$, measured by using FT-IR (Fourier Transform Infrared Spectroscopy). Measured data of an infrared absorption spectrum of metal boron by H. Werheit et al. is also shown for comparison.

Three peaks D, E, F contained in the infrared absorption spectrum of the supersaturated impurity layer 2 illustrated in FIG. 6 corresponds to peaks $P_1$, $P_2$, $P_3$ of the infrared absorption spectrum of metal boron by H. Werheit et al. respectively. That is, the infrared absorption spectrum of the supersaturated impurity layer 2 roughly matches the infrared absorption spectrum of metal boron. This result also substantiates the presence of the $B_{12}$ cluster in the supersaturated impurity layer 2.

Figure 7:
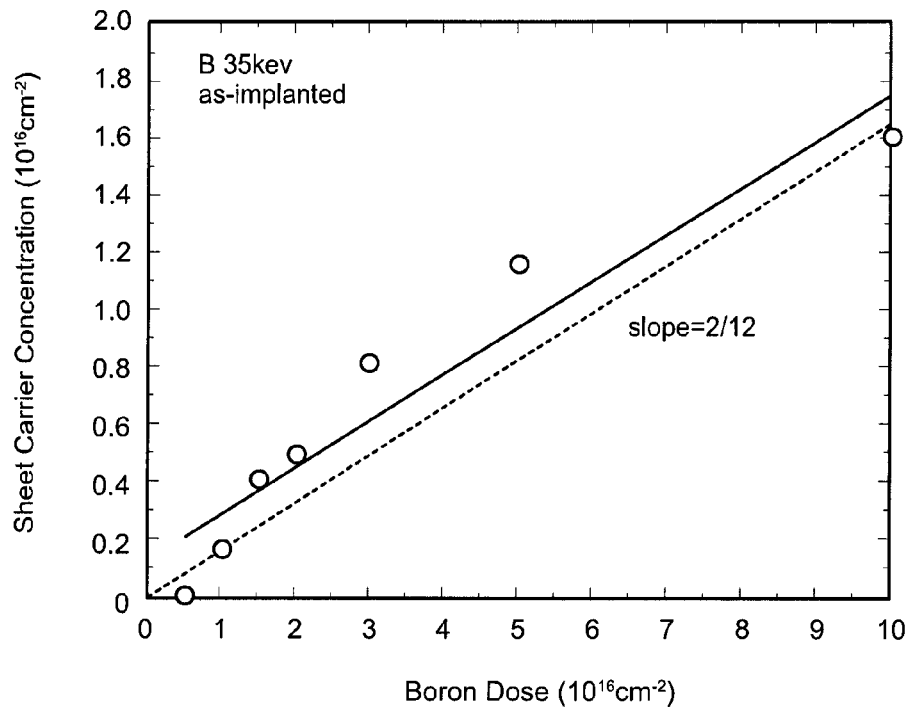

FIG. 7 is a graph illustrating a relationship between the dose amount of boron and the sheet carrier concentration of the supersaturated impurity layer 2 after ion implantation. When the dose amount is $1 \times 10^{16}$ cm$^{-2}$ or more, the generation of carriers is verified immediately after ion implantation and the sheet carrier concentration increases with an increasing dose amount. Then, the rate of increase of the sheet carrier concentration approaches the inclination of ⅙ shown in FIG. 7. This indicates that with an increasing dose amount, the formation of the $B_{12}$ cluster proceeds, which causes a bivalent electron deficiency state.

Thus, in the embodiment, an ion implantation with the dose amount of boron that creates supersaturation in a silicon crystal is performed to form a $B_{12}$ cluster, inducing a bivalent electron deficiency state. Since the $B_{12}$ cluster incorporates metallic elements, the metallic impurities are effectively gettered in the supersaturated impurity layer 2.

Figure 8:
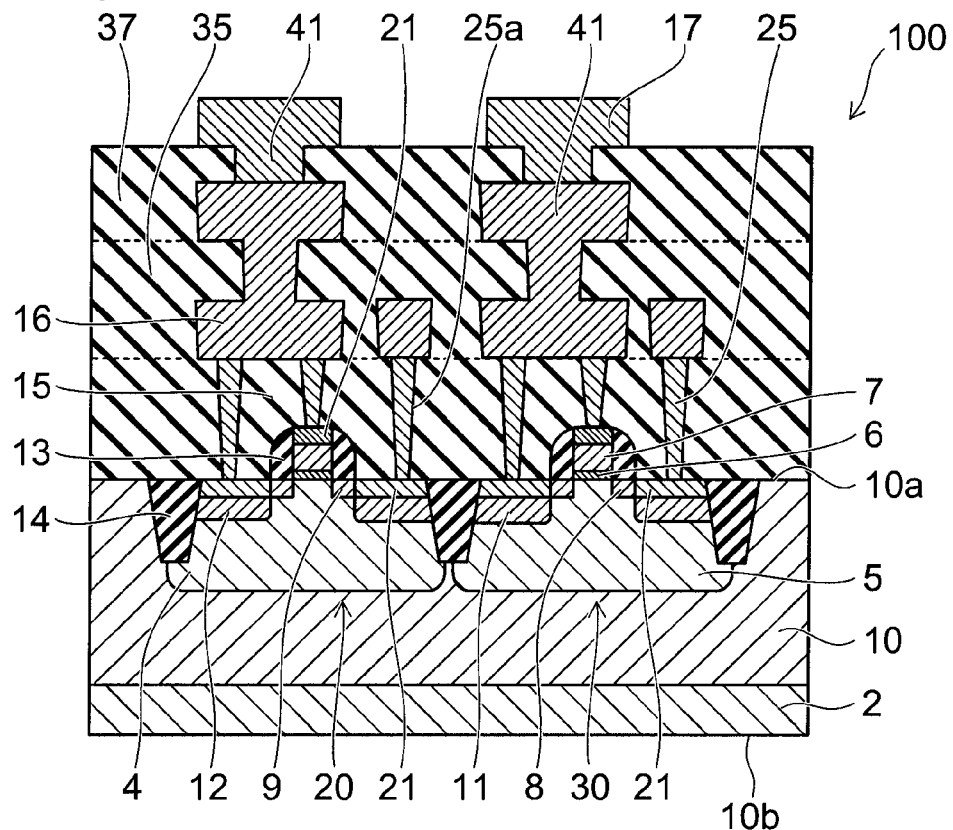
FIG. 8 is a schematic sectional view illustrating a semiconductor device according to the first embodiment.

FIG. 8 is a schematic sectional view illustrating a semiconductor device 100 according to the first embodiment. The semiconductor device 100 is a CMOSFET including an n-channel MOSFET 20 and a p-channel MOSFET 30 as active elements. The manufacturing process of the semiconductor device 100 will be described below with reference to FIGS. 1 and 8.

The manufacturing process of the semiconductor device 100 includes a step of forming a region in which boron is contained with the density of $2\times10^{20}$ cm$^{-3}$ or more by performing an ion implantation of boron on the back side of the substrate 10, and a step of forming a region (first region) provided with the n-channel MOSFET 20 and the p-channel MOSFET 30 on the first major surface 10a, which is a portion not containing boron.

First, as illustrated in FIG. 1, the ion implantation of boron is performed on the second major surface 10b (back side) of the substrate 10 to form the supersaturated impurity layer 2. Ion implantation conditions include the implantation energy 35 keV and the dose amount $1\times10^{17}$ cm$^{-2}$. In this case, the maximum concentration of boron in the implantation region becomes $7.5\times10^{21}$ cm$^{-3}$.

For example, a silicon substrate is used as the substrate 10. However, the substrate 10 is not limited to the silicon substrate and a substrate containing Si such as SiC and SiGe may also be used therefor.

Next, as illustrated in FIG. 8, an STI (Shallow Trench Isolation) 14 is formed on the first major surface 10a on the opposite side of the second major surface 10b. The STI 14 is, for example, silicon oxide ($SiO_2$ film) obtained by selectively oxidizing the substrate 10 and electrically insulates the n-channel MOSFET 20 from the p-channel MOSFET 30. The STI 14 also insulates an active region including the n-channel MOSFET 20 and the p-channel MOSFET 30 from other portions of the substrate 10.

Next, a p-well 4 and an n-well 5 are formed on the first major surface 10a. The p-well 4 is formed by, for example, an ion implantation of boron (B) as a p-type impurity and driving by heat treatment. The n-well 5 is formed by, for example, an ion implantation of arsenic (As) as an n-type impurity and driving.

Next, a gate oxide film 6 and a gate electrode 7 are formed on the side of the first major surface 10a. For example, the front face of the substrate 10 is thermally oxidized to form an $SiO_2$ film and then a polysilicon film is formed on the $SiO_2$ film. Further, the polysilicon film and the $SiO_2$ film are patterned by using RIE (Reactive Ion Etching) to form the gate oxide film 6 and the gate electrode 7.

Next, a shallow impurity diffusion layer 8 (extension layer) doped with a p-type impurity is formed from the surface of the p-well 4 and a shallow impurity diffusion layer 9 (extension layer) doped with an n-type impurity is formed from the surface of the n-well 5. These impurity diffusion layers 8, 9 are formed by selective ion implantation of a p-type impurity and an n-type impurity in the p-well 4 and the n-well 5 respectively by using the gate electrode 7 as a mask.

Next, after forming a sidewall 13 on the side surface of the gate electrode 7, a source/drain region 11 of a high carrier density is formed by a selective ion implantation of a p-type impurity on the surface of the p-well 4. Then, a source/drain region 12 of a high carrier density is formed by a selective ion implantation of an n-type impurity on the surface of the n-well 5.

Next, a silicide layer 21 containing a transition metal is formed on the surface of the source/drain regions 11, 12 and the upper surface of the gate electrode 7. The silicide layer 21 is nickel silicide ($NiSi_2$) formed on the surface of the source/drain regions 11, 12 and the upper surface of the gate electrode 7 by, for example, forming a nickel (Ni) film and then treating the Ni film thermally.

Next, an interlayer dielectric film 15 is formed thereon. A contact hole 25a communicatively connected to the gate electrode 7 and the source/drain regions 11, 12 is formed in the interlayer dielectric film 15, and a contact plug 25 is embedded therein. The contact plug 25 has a structure in which, for example, titanium (Ti), titanium nitride (TiN), and tungsten (W) are stacked in this order.

Next, a metallic interconnection 16 is formed on the interlayer dielectric film 15 and further interlayer dielectric films 35, 37 containing a 2-layer interconnection 41 are formed thereon. For example, a copper (Cu) may be used as a material for the 2-layer interconnection 41. Lastly, a pad electrode 17 is formed on the interlayer dielectric film 37. For example, aluminum (Al) is used for the pad electrode 17.

In the above configuration, the carrier concentration of the p-well 4 and the n-well 5 is, for example, $5\times10^{17}$ cm$^{-3}$ and the carrier concentration of the extension layers 8, 9 is, for example, $1\times10^{20}$ cm$^{-3}$. The carrier concentration of source/drain regions 11, 12 is $5\times10^{20}$ cm$^{-3}$ or less and all concentrations are lower than the concentration of the supersaturated impurity layer 2.

The maximum temperature for the heat treatments in the above manufacturing process is, for example, 1035° C., but the treatment time at the maximum temperature is extremely short. That is, the temperature is raised up to a predetermined temperature and then lowered soon after reaching the maximum temperature, i.e. the holding time at the maximum temperature is zero. On the other hand, the longest treatment time is about 200 minutes and the temperature of the treatment is 500° C.

In the embodiment, metallic impurities are gettered by the supersaturated impurity layer 2 through the above manufacturing process. Table 1 shows the amount of metallic impurities gettered in the supersaturated impurity layer 2 after the ion implantation of boron on the backside of the substrate 10 and after completing the above manufacturing process of the semiconductor device 100. The amount of metallic impurities is measured by dissolving the backside of the substrate 10 about 1 μm by an etchant containing $HF/HNO_3$ and performing an atomic absorption analysis of the recovered etchant.

TABLE 1

| Measured element | Na | Al | Cr | Fe | Co | Ni | Cu | Mg | Ti | Zn |
|---|---|---|---|---|---|---|---|---|---|---|
| After forming supersaturated layer ($\times10^{10}$ cm$^{-3}$) | 0.52 | 4.9 | — | 0.046 | — | 0.011 | 0.16 | 0.12 | — | 0.008 |
| After forming semiconductor device ($\times10^{10}$ cm$^{-3}$) | 3.6 | 170 | 0.057 | 39 | — | 3.5 | 6.2 | 0.27 | 1 | 0.082 |
| Minimum limit of detection ($\times10^{10}$ cm$^{-3}$) | 0.01 | 0.03 | 0.01 | 0.03 | 0.01 | 0.003 | 0.008 | 0.005 | 0.4 | 0.002 |

The difference between the amount of each metal element after forming the semiconductor device 100 and the amount of each metal element after forming the supersaturated impurity layer 2 is the amount of metallic impurities gettered in the above manufacturing process. Each of the metal elements detected after forming the supersaturated impurity layer 2 is considered to be contamination up to the process of ion implantation.

After the semiconductor device 100 is formed, metallic impurities used in the manufacturing process such as Al, Fe, Ni, Cu, and Ti are detected with a higher level ($10^{10}$ to $10^{12}$ $cm^{-3}$). Thus, it is found that the supersaturated impurity layer 2 including the $B_{12}$ cluster traps metallic impurities generated by cross contamination in the above manufacturing process.

As described above, the ion implantation with the amount of boron that creates supersaturation in a silicon crystal is performed to form a $B_{12}$ cluster, which allows a bivalent electron deficiency state to be induced in the substrate 10. Then, metallic impurities can be gettered effectively into the $B_{12}$ cluster by generating holes of the solubility limit concentration or more in the silicon crystal.

Such an effect can be realized by forcing over-doping of boron by using ion implantation. For example, the supersaturation state cannot be formed by using the doping method of substituting an impurity element in a lattice position of a substrate crystal. According to the embodiment, a $B_{12}$ cluster is formed in the ion implantation process and thus, a gettering site (supersaturated impurity layer 2) can easily be formed comparing with the formation of a precipitation nucleus by carbon doping or nitrogen doping.

The formation of the supersaturated impurity layer 2 is not limited to the initial stage of the manufacturing process and can be implemented by the ion implantation in any process. The $B_{12}$ cluster contained in the supersaturated impurity layer 2 is thermally stable and exerts less influence on other regions. Further, the supersaturated impurity layer 2 can be removed by etching in the course of the manufacturing process. That is, the embodiment has a high level of flexibility in the application to the manufacturing process and is also less limited in its implementation.

The embodiment shows an example in which the supersaturated impurity layer 2 including the $B_{12}$ cluster remains after completing the manufacturing process, but, for example, the supersaturated impurity layer 2 may be removed by grinding or polishing the back side of the substrate 10.

Second Embodiment

Figure 9:
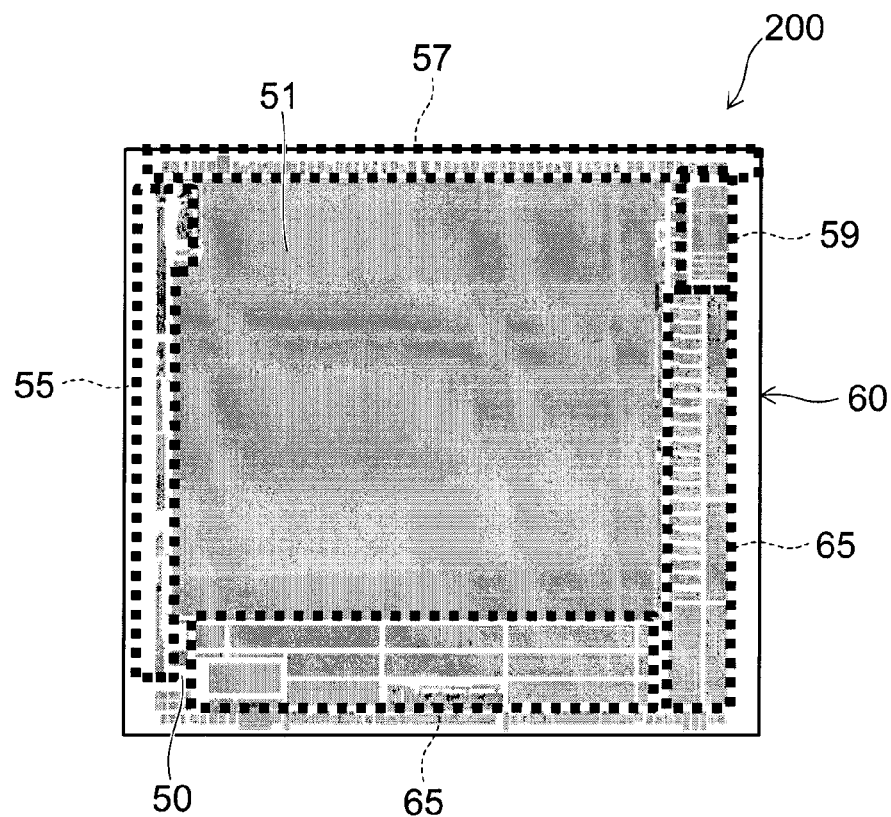
FIG. 9 is a plan view schematically illustrating a semiconductor device according to a second embodiment.

FIG. 9 is a plan view schematically illustrating a semiconductor device 200 according to a second embodiment. The semiconductor device 200 is a CMOS image sensor and includes a pixel area 51 and a peripheral circuit.

As illustrated in FIG. 9, the peripheral circuit includes a logic area 53, a power unit 55, a column ADC (Column Analog/Digital Converter) 57, and a circuit controller 59. Each element of the peripheral circuit is arranged on the first major surface 10a of the substrate 10 together with the pixel area 51. Also in the semiconductor device 200, as illustrated in FIG. 1, the supersaturated impurity layer 2 can be formed on the second major surface 10b.

Figure 10:
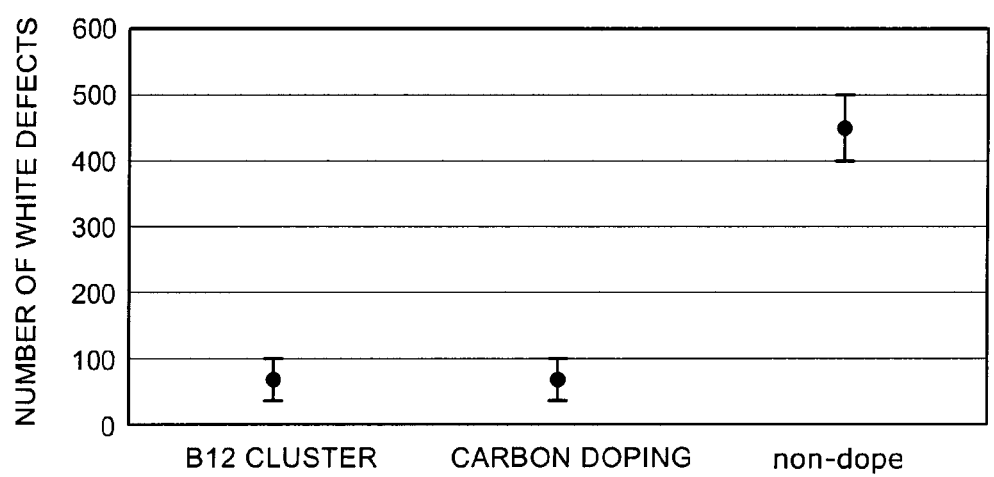
FIG. 10 is a graph showing a property of the semiconductor device according to the second embodiment.

FIG. 10 is a graph illustrating properties of the semiconductor device 200 formed by using three types of substrates. The three types of substrates include a silicon substrate in which the supersaturated impurity layer 2 is formed and including a $B_{12}$ cluster, a silicon substrate in which a precipitation nucleus is formed by carbon doping, and a non-doped silicon substrate having no gettering site.

The semiconductor device 200 has 5 megapixels in the pixel area 51, where the pixel size is 1.75 μm. FIG. 10 illustrates the number of white defects (pixels generating electrons even when no light is shone thereon) caused in the pixel area 51 for each substrate.

As illustrated in FIG. 10, more than 400 white defects are observed in the non-doped silicon substrate. In contrast, the number of white defects is suppressed to 100 or less in the silicon substrate doped with carbon and the silicon substrate including the $B_{12}$ cluster. Thus, the supersaturated impurity layer 2 including a $B_{12}$ cluster acts effectively as a gettering layer of metallic impurities.

The supersaturated impurity layer 2 may be provided on the side of the first major surface 10a, as well as on the backside (second major surface 10b) of the substrate 10. That is, the supersaturated impurity layer 2 may be formed in an intermediate area 50 between the pixel area 51 and each element of the peripheral circuit including active elements. Alternatively, the supersaturated impurity layer 2 may be formed in a dicing area 60 defining each of a plurality of the semiconductor devices 200 provided on the first major surface 10a. Accordingly, the gettering of metallic impurities is made possible even after grinding or polishing the backside.

Third Embodiment

Figure 11:
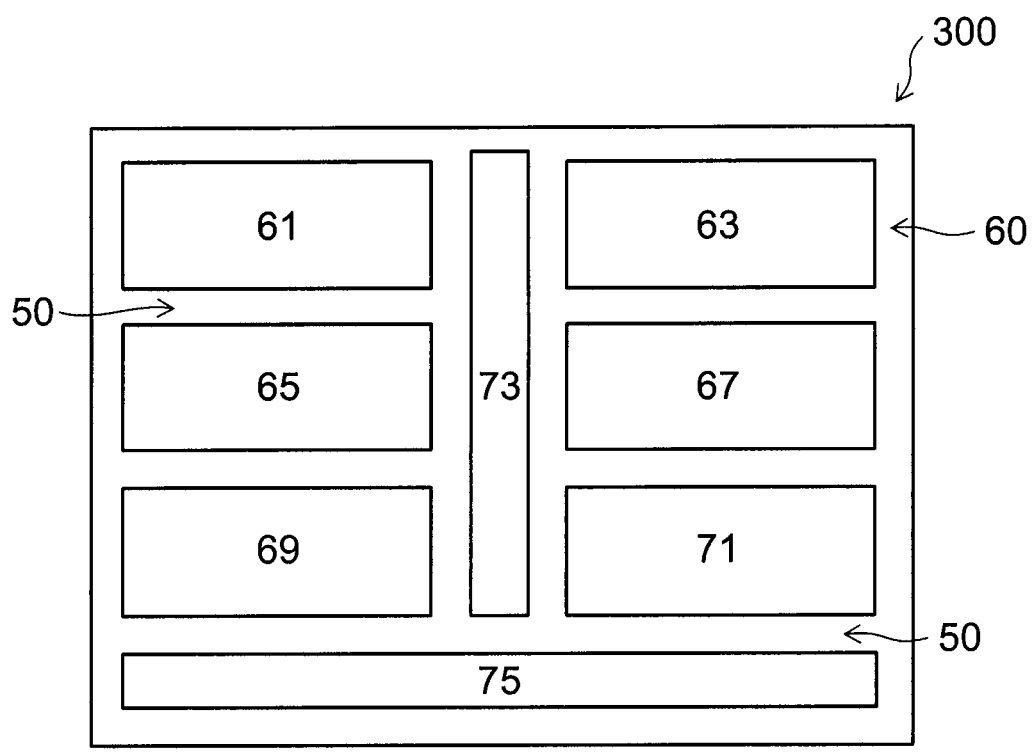
FIG. 11 is a plan view schematically illustrating a semiconductor device according to a third embodiment.

FIG. 11 is a plan view schematically illustrating a semiconductor device 300 according to a third embodiment. The semiconductor device 300 is a general-purpose logic IC (Integrated Circuit) and includes a pair of microprocessor units (MPU) 61, 63, a pair of logic blocks 65, 67, an analog IP (intellectual property core) 69, and a memory unit (for example, mixed DRAM: Dynamic Random Access Memory) 71 as structural elements. Further, an internal bus 73 to mutually connect these circuit elements and an input/output unit 75 are included.

Also in the semiconductor device 300, each structural element including active elements is provided on the first major surface 10a of the substrate 10. Then, the supersaturated impurity layer 2 can be formed on the second major surface 10b. The supersaturated impurity layer 2 may also be provided in the second region outside the first region where each structural element on the first major surface 10a is provided. That is, the supersaturated impurity layer 2 can be formed in the intermediate area 50 or the dicing area 60 between each element by the selective ion implantation of boron.

Accordingly, contamination of metallic impurities in each structural element can be suppressed so that reliability of the semiconductor device 300 may be improved.

Fourth Embodiment

Figure 12:
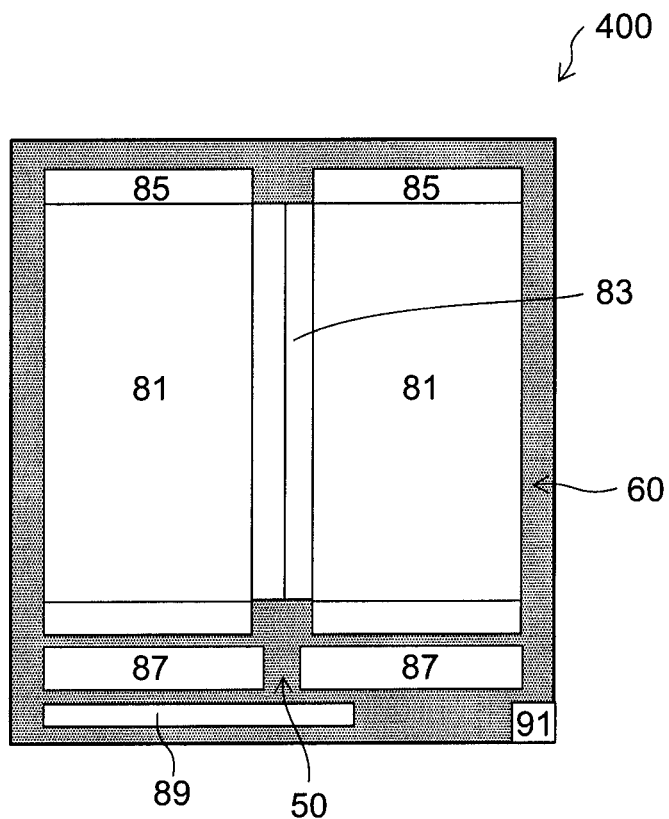
FIG. 12 is a plan view schematically illustrating a semiconductor device according to a fourth embodiment.

FIG. 12 is a plan view schematically illustrating a semiconductor device 400 according to a fourth embodiment. The semiconductor device 400 is a NAND memory and includes a cell array area 81, a row decoder 83, a sense amplifier 85, and a bit line circuit 87 as structural elements. Further, a bonding pad 89 leading to these circuit elements and a power unit 91 are included.

Also in the semiconductor device 400, each structural element including active elements is provided on the first major surface 10a of the substrate 10 and the supersaturated impurity layer 2 can be formed on the second major surface 10b. In addition, the supersaturated impurity layer 2 may be formed in the intermediate area 50 or the dicing area 60 between each element. Accordingly, contamination of metallic impurities can be suppressed so that reliability of the semiconductor device 400 may be improved.

As illustrated in the first to fourth embodiments described above, the $B_{12}$ cluster inducing a bivalent electron deficiency state can be formed by the ion implantation of boron exceeding the solubility limit. Further, the $B_{12}$ cluster is formed in a process of ion implantation and thus, the supersaturated impurity layer 2 can easily be formed so that metallic impurities can be gettered even in a manufacturing process of a semiconductor device in which the thermal budget is inhibited. Moreover, the supersaturated impurity layer 2 can be formed in any region outside the active region containing active elements and has a high level of flexibility in the application to the manufacturing process. Accordingly, quality and reliability of the semiconductor device can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a substrate containing silicon, and provided with a first region including an active element, the substrate including a second region containing boron in a dose amount of more than $1 \times 10^{16}$ cm$^{-2}$ on a surface excluding the first region, wherein the second region is provided in an electrically non-functional area, and contains a cluster of an icosahedral structure including 12 atoms of the boron.

2. The device according to claim 1, wherein a concentration distribution of the boron has a peak at a position deeper from a surface of the second region.

3. The device according to claim 1, wherein the second region has a hole concentration exceeding a solubility limit of boron in silicon.

4. The device according to claim 1, wherein the second region includes a bivalent electron deficiency state induced by the cluster.

5. The device according to claim 1, wherein the substrate includes a first major surface provided with the first region and a second major surface provided with the second region on an opposite side of the first major surface.

6. The device according to claim 1, wherein the second region is included in a dicing area provided on the first major surface.

7. The device according to claim 1, wherein the active element includes a MOSFET.

8. The device according to claim 1, wherein the first region includes a pixel area and a peripheral circuit.

9. The device according to claim 1, wherein the first region includes a microprocessor.

10. The device according to claim 1, wherein the first region includes a NAND memory.

11. The device according to claim 1, wherein the second region has a carrier concentration of $2 \times 10^{20}$ cm$^{-1}$ or more.

* * * * *